(12) United States Patent
Lenz

(10) Patent No.: US 6,716,762 B1
(45) Date of Patent: Apr. 6, 2004

(54) PLASMA CONFINEMENT BY USE OF PREFERRED RF RETURN PATH

(75) Inventor: Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/410,022

(22) Filed: Apr. 8, 2003

Related U.S. Application Data

(62) Division of application No. 09/846,172, filed on Apr. 30, 2001, now Pat. No. 6,602,381.

(51) Int. Cl.[7] .................. H01L 21/00; C23F 1/100; H05H 1/00; C13C 16/00
(52) U.S. Cl. .................. 438/710; 216/67; 156/345.1; 118/715
(58) Field of Search .................. 438/710; 216/67; 156/345.1, 345.43; 118/715, 723 E; 315/111.71, 111.31

(56) References Cited

U.S. PATENT DOCUMENTS

| | | | |
|---|---|---|---|
| 5,534,751 A | 7/1996 | Lenz et al. | 315/111.71 |
| 5,744,049 A | 4/1998 | Hills et al. | 216/67 |
| 5,904,800 A | 5/1999 | Mautz | 56/345.1 |
| 5,998,932 A | 12/1999 | Lenz | 315/111.21 |
| 6,019,060 A | 2/2000 | Lenz | 118/723 |
| 6,129,808 A | 10/2000 | Wicker et al. | 56/745.1 |
| 6,178,919 B1 | 1/2001 | Li et al. | 118/723 |

OTHER PUBLICATIONS

PCT International Search Report for PCT/US 02/10460, date of mailing Jul. 23, 2002.

Primary Examiner—Parviz Hassanzadeh
(74) Attorney, Agent, or Firm—Thelen Reid & Priest LLP; Thierry K. Lo

(57) ABSTRACT

A confinement assembly for confining a discharge within an interaction space of a plasma processing apparatus comprising a stack of rings and at least one electrically conductive member. The rings are spaced apart from each other to form slots therebetween and are positioned to surround the interaction space. At least one electrically conductive member electrically couples each ring. The electrically conductive member contacts each ring at least at a point inside of the outer circumference of each ring.

8 Claims, 4 Drawing Sheets

PLASMA CONFINEMENT BY USE OF PREFERRED RF RETURN PATH

CROSS-RELATED APPLICATIONS

The present application is a divisional application based on application Ser. No. 09/846,172, filed Apr. 30, 2001 now U.S. Pat. No. 6,202,381, entitled "Plasma confinement by use of preferred return path" in the name of inventor Eric H. Lenz commonly assigned herewith.

FIELD OF THE INVENTION

The present invention relates to plasma etching apparatus. More particularly, the present invention relates to improved techniques for controlling plasma formation in a plasma processing chamber.

BACKGROUND OF THE INVENTION

The use of plasma-enhanced processes in the manufacture of semiconductor-based products (such as integrated circuits or flat panel displays) is well known. Generally speaking, plasma-enhanced processes involve the processing of a substrate (e.g., a glass panel or a semiconductor wafer) in a plasma processing chamber. Within the plasma processing chamber, a plasma may be formed out of appropriate etchant or deposition source gases to respectively etch or deposit a layer of material on the surface of the substrate.

FIG. 1 depicts a capacitively-coupled plasma processing chamber 100, representing an exemplary plasma processing chamber of the types typically employed to etch a substrate. A chuck 104 represents the workpiece holder on which a substrate 106 is positioned during etching. The chuck 104 may be implemented by any suitable chucking technique, e.g., electrostatic, mechanical, clamping, vacuum, or the like. During etching, the chuck 104 is typically supplied with RF power having a frequency of, for example, about 400 Khz to about 27 Mhz, by an RF power supply 110. In some systems, chuck 104 may be supplied with dual frequencies, e.g., 2 MHz and 27 MHz simultaneously during etching.

A reactor top 112, formed of a conductive material such as aluminum, is disposed above substrate 106. Confinement rings 102 may be coupled in a fixed manner to reactor top 112 or may be coupled to cam-based plungers (not shown in FIG. 1) that allow confinement rings 102 to be raised and lowered without moving reactor top 112.

In general, confinement rings 102 help confine the etching plasma to the region above substrate 106 to improve process control and to ensure repeatability. Although only two confinement rings are shown in the example of FIG. 1, it should be understood that any number of confinement rings may be provided.

An upper electrode 114 and a baffle 116 are also coupled to reactor top 112. The upper electrode 114 may be grounded (as in the case of FIG. 1) or may be powered by another RF power source 120 during etching. If the upper electrode 114 is powered, it may be insulated from the remainder of the reactor to isolate the electrode from ground. During etching, plasma is formed from etchant source gas supplied via a gas line 122 and the baffle 116.

When RF power is supplied to the chuck 104 (from the radio frequency generator 110), equipotential field lines are set up over the substrate 106. During plasma processing, the positive ions accelerate across the equipotential field lines to impinge on the surface of substrate 106, thereby providing the desired etch effect (such as improving etch directionality). Due to geometry factors, however, the field lines may not be uniform across the substrate surface and may vary significantly at the edge of substrate 106. Accordingly, a focus ring is typically provided to improve process uniformity across the entire substrate surface. With reference to FIG. 1, chuck 104 is shown disposed within a focus ring 108, which is typically formed of a suitable dielectric material such as ceramic, quartz, or plastic.

The equipotential field lines that are set up during plasma etching may be seen more clearly in FIG. 1B. In FIG. 1B, the presence of focus ring 108 allows the equipotential field lines to be disposed substantially uniformly over the entire surface of the substrate, thereby allowing etching to proceed in a uniform manner across the substrate. As seen by FIG. 2, however, some of the equipotential field lines also extend into the region 160 outside of focus ring 108. The presence of the equipotential field lines in region 160 may cause any charged particles that leak past the confinement rings to accelerate in a direction perpendicular to the equipotential field lines toward the chamber walls. This acceleration and the subsequent collision between the charged particles and the chamber walls may generate secondary electrons, which may ignite and/or sustain unconfined plasma in the region 160 (i.e., unintended plasma that is not confined to region directly above the substrate).

Furthermore, current return paths have relied on the chamber wall 118 for a return path or a return path outside the chamber. Magnetic fields are generated from the return paths and cause magnetic fields that can light and sustain a plasma outside the confined region. The dotted lines in FIGS. 1A and 1B illustrate the current return path along the chamber wall 118.

The inadvertent generation of plasma in the region 160 renders the etch process difficult to control and may damage components within this region. By way of example, this unconfined plasma, which may be unplanned and/or intermittent, changes the location of power absorbed by the plasma within the plasma processing chamber, thereby making it difficult to control the delivery of power to the chuck to achieve consistent, repeatable etch results. As another example, the presence of unwanted plasma in region 160 may cause damage to the chamber door (not shown), particularly to the seals that are provided therewith. The chamber door is necessary for substrate transport into and out of the chamber, and if the seals are damaged, accurate control of the chamber pressure may be difficult. When the seals and/or other components in the region 160 are inadvertently attacked by the plasma, particulate and/or polymeric contaminants may form along the chamber walls, potentially leading to contamination of the etch environment.

Accordingly, it would be desirable to provide techniques for minimizing and/or eliminating the unwanted plasma formation in the region outside of the focus ring of the plasma processing chamber.

BRIEF DESCRIPTION OF THE INVENTION

A confinement assembly for confining a discharge within an interaction space of a plasma processing apparatus comprising a stack of rings and at least one electrically conductive member. The rings are spaced apart from each other to form slots therebetween and are positioned to surround the interaction space. At least one electrically conductive member electrically couples each ring. The electrically conductive member contacts each ring at least at a point inside of the outer circumference of each ring.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1A:
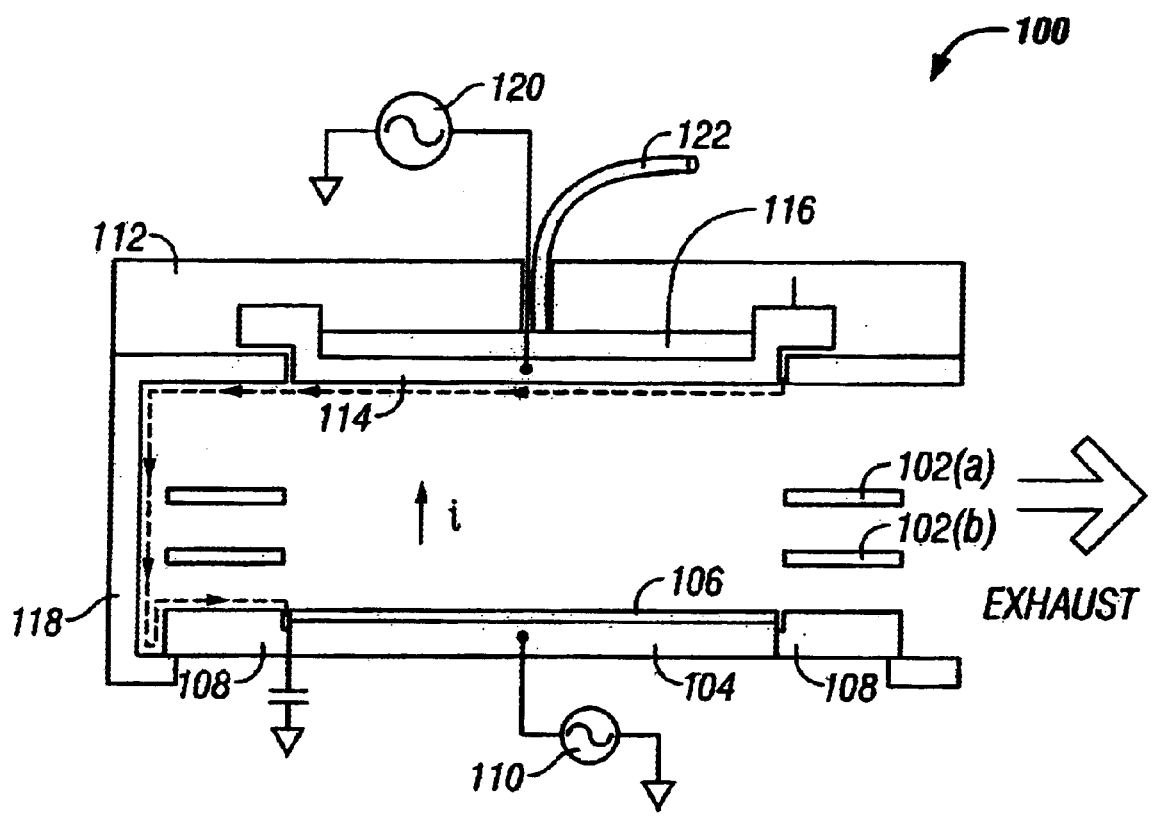
FIG. 1A is schematic diagram illustrating a typical capacitively coupled plasma processing chamber in accordance with the prior art.
Figure 1B:
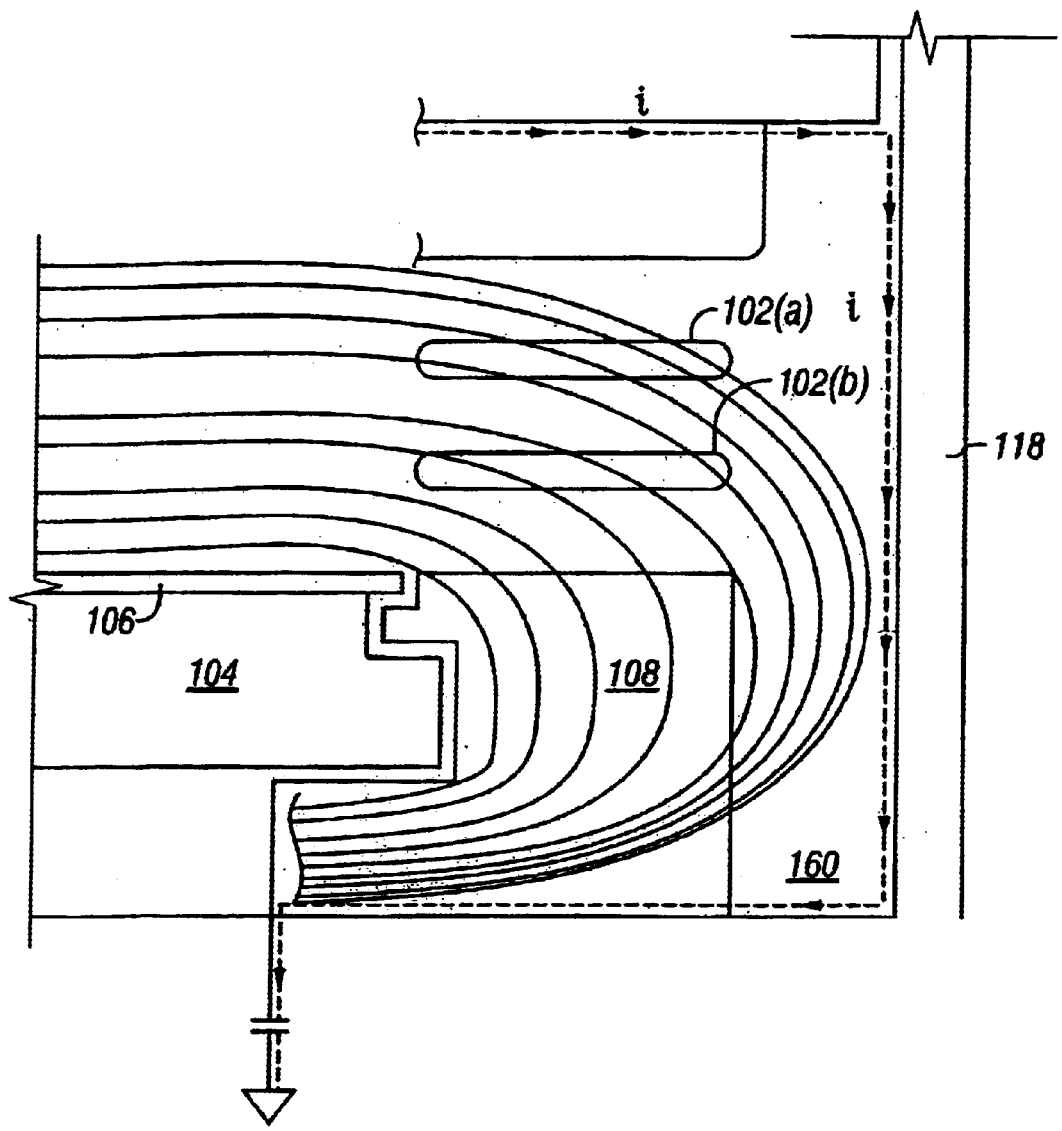
FIG. 1B a schematic diagram illustrating the equipotential field lines that may be formed in the plasma processing chamber of FIG. 1A during plasma processing in accordance with the prior art.

Embodiments of the present invention are described herein in the context of controlling plasma formation in a plasma processing chamber. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one aspect of the present invention, process control is substantially improved by reducing or eliminating the unconfined plasma (i.e., the unwanted plasma that is inadvertently ignited and/or sustained outside of the focus ring and the walls of the plasma chamber). Confinement rings consists of a stack of rings spaced apart from each other to form slots therebetween and positioned to surround the interaction space. During operation of the plasma processing apparatus, the distance an exiting charged particle must travel in the slot is substantially longer than its mean free path. As the term is employed herein, the region outside of the focus ring refers to annular region of the plasma processing chamber which is external to the column of space whose outer periphery is defined by the circumference of the focus ring. The plasma is preferably confirmed within this column of space. Outside of the focus ring, the electric field is preferably reduced to the point where plasma can no longer be sustained. By eliminating the unconfined plasma, the amount of power absorbed by the etching plasma that is disposed above the substrate may be more consistent from 1, substrate to substrate, thereby rendering the etch repeatable. The elimination of the unconfined plasma also helps reduce the corrosion or break down of components disposed in the region outside of the focus ring (e.g., door seals).

In accordance with one embodiment of the present invention, there is provided a confinement assembly, including a stack of focus rings configured to concentrate the equipotential field lines in the focus ring body. The focus rings preferably include at least one cavity disposed evenly around each ring and a corresponding number of electrically conductive members for returning the current to the ground. Each cavity receives and accommodates one member. It is believed that this configuration substantially reduces the density of equipotential field lines in the region outside of the focus ring. By substantially reducing the density of equipotential field lines in the near-vacuum region outside of the focus ring, the amount of energy acquired by any charged particle that leaks into this area is substantially reduced, thereby essentially eliminating the possibility of plasma formation and/or sustenance in this region.

Other embodiments may exist in which an electrically conductive member connects each ring at least a point inside of the outer circumference of the ring. The magnetic fields generated by the electrically conductive member are substantially reduced from an excluded region when the member is disposed within the ring. The member may include any shape or form that allows the current to return to the ground while substantially reducing the magnetic fields generated by the member. Examples of members may be rods, strings, or beams connecting the rings at least at a point inside of the outer circumference of the rings.

Figure 2:
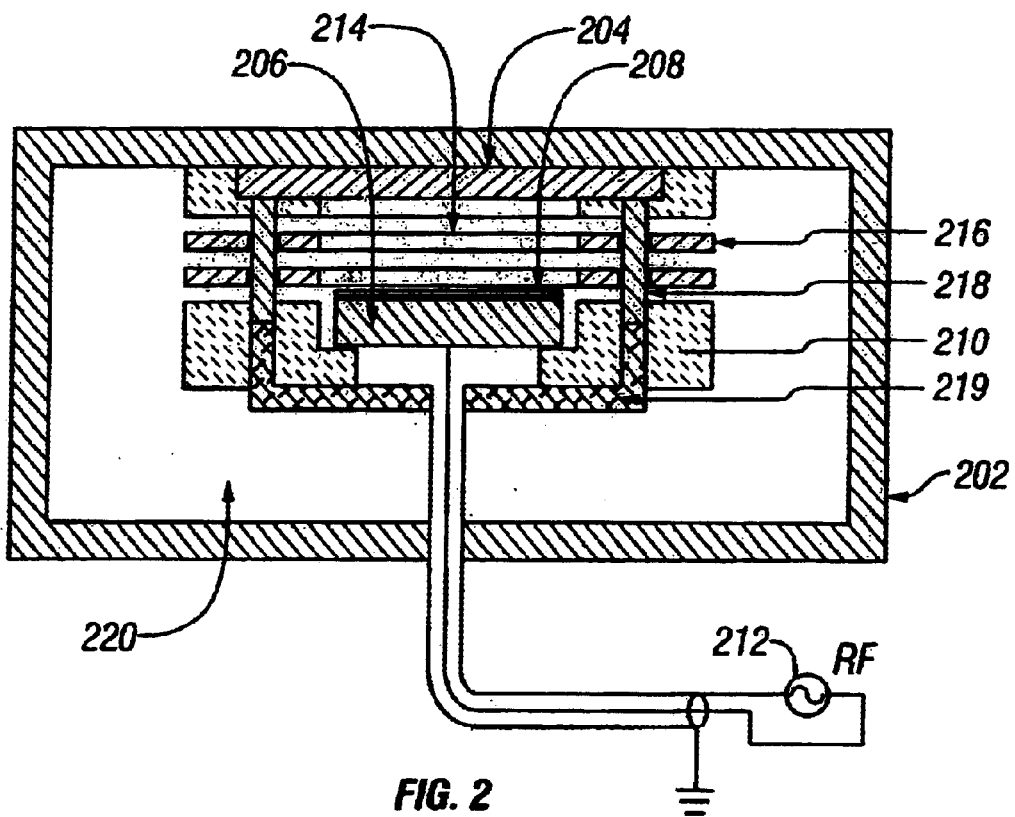
FIG. 2 is a schematic cross-sectional diagram of a capacitively coupled plasma processing chamber having a preferred return path in accordance with a specific embodiment of the present invention.
Figure 3:
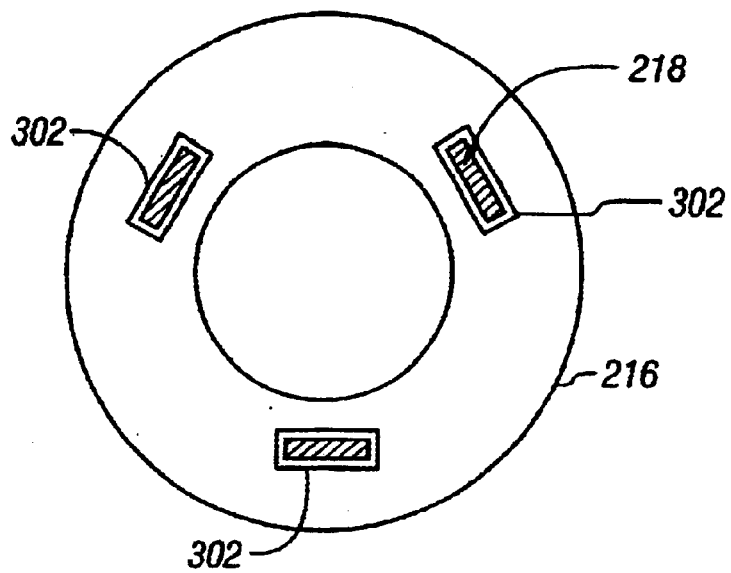
FIG. 3 illustrates a top view of a confinement ring having a preferred return path in accordance with a specific embodiment of the present invention.

The confinement rings 216 also include at least one cavity 302, equidistant from each other, as illustrated in FIG. 3. FIG. 3 illustrates a preferred embodiment in which the confinement rings include three cavities. The cavities 302 may include a slit. Each slit receives an electrically conductive member 218 that may not contact the confinement rings 216. The slits are preferably positioned equidistantly between the inner edge and the outer edge of the confinement rings 216 as illustrated in FIG. 3 to deeply bury and isolate the magnetic fields generated by the members 218. Such members 218 may preferably include a beam of highly conductive material, such as aluminum. As seen in FIG. 2, each member 218 may be disposed vertically within the cavities 302 of each confinement ring 216. The top of each member 218 electrically contacts the upper electrode 204. The bottom of each member 216 electrically contacts the grounded shield 219. Therefore, each member 216 is sandwiched between the upper electrode 204 and the grounded shield 219 which also provides support to each member 218.

The power supply 212 provides an RF current to the lower electrode 206. During the process, the current travels towards the upper electrode 204 through the confinement region 214. Because the upper electrode 204 electrically contacts members 218, the current travels through this preferred path, i.e. members 218, towards the grounded shield 219.

The presence of the members 218 embedded within the cavities 302 of the confinement rings 216 provides a pre ferred return path that substantially reduces the density of the magnetic fields in the upper portion of annular region 220, i.e., the region outside of the focus and confinement rings 216. The confinement rings 216 isolate the plasma and the chamber 202 from the preferred return paths. Being embedded in the confinement rings 216, the stray magnetic fields are kept from penetrating into the volume between the outer edge of the confinement rings 216 and the chamber 202, i.e. the region 220. The plasma stays confined and since the return paths are in the confinement ring area, the plasma cannot damage the return path materials. Therefore the stray magnetic fields are substantially reduced outside the confinement rings 216.

Other embodiments may exist in which an electrically conductive member connects each ring at least a point inside of the outer circumference of the ring. The magnetic fields generated by the electrically conductive member are substantially reduced from an excluded region when the member is disposed within the ring. The member may include any shape or form that allows the current to return to the ground while substantially reducing the magnetic fields generated by the member. Examples of members may be rods, strings, or beams connecting the rings at a least a point inside of the outer circumference of the rings.

Figure 4:
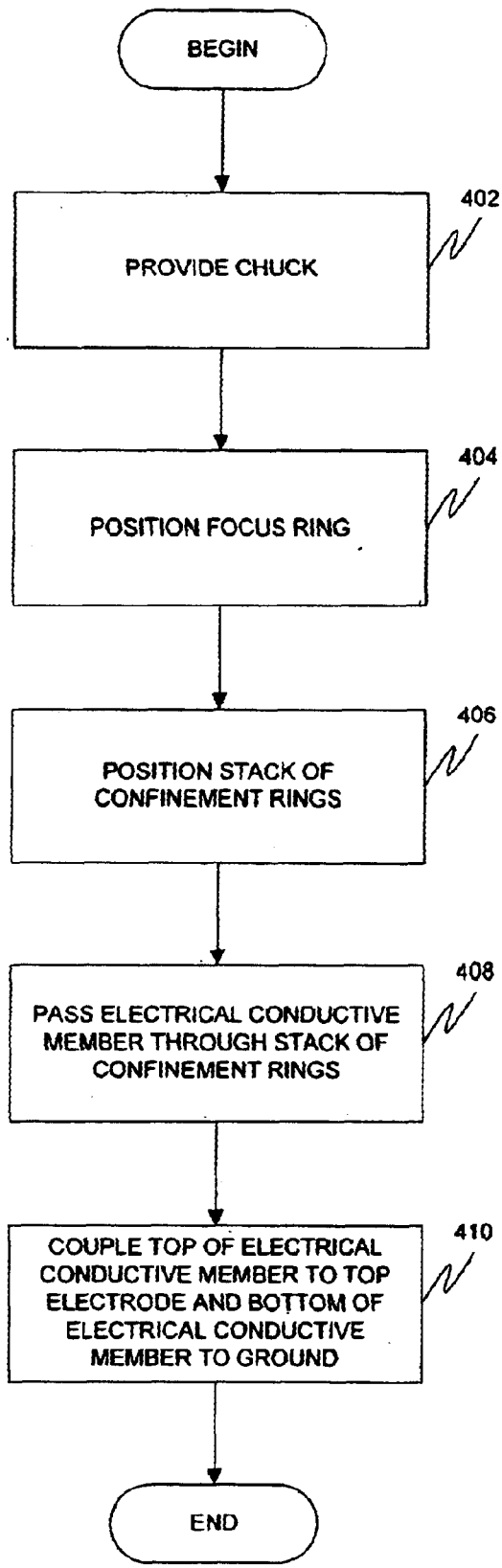
FIG. 4 is a flow chart diagram illustrating a method for forming a confinement assembly of a plasma processing chamber.

FIG. 4 is a flow chart diagram illustrating a method for forming a confinement assembly of a plasma processing chamber. At 402, a chuck for supporting the substrate during plasma processing is provided. At 404, a focus ring is positioned to substantially encircle the wafer. At 406, a stack of confinement rings, made of electrically insulating material, spaced apart from each other to form slots therebetween is positioned to surround an interaction space defined between a top electrode and the chuck. Each confinement ring has at least one cavity formed on the surface thereof. At 408, at least one electrically conductive member passes through each of the cavity of the stack of confinement rings. At 410, the top of the electrically conductive member is electrically coupled to the top electrode and the bottom of the electrically conductive member is grounded.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for forming a confinement assembly of a plasma processing chamber having an interaction space confined between a top electrode and a bottom electrode, said method comprising:

positioning a stack of confinement rings, made of electrically insulating material, spaced apart from each other to form slots therebetween to surround the interaction space of the plasma processing chamber, each confinement ring having at least one cavity formed on the surface thereof;

positioning a focus ring to surround the bottom electrode; and passing an electrically conductive member through each of said cavity of said stack of confinement rings, a top of said conductive member electrically coupled to the top electrode, said electrically conductive member grounded at a bottom thereof.

2. The method according to claim 1 wherein said stack of rings comprises an electrically insulating material.

3. The method according to claim 2 wherein said electrically insulating material comprises quartz.

4. The method according to claim 1 wherein said electrically conducive member compressing aluminum.

5. A method for confining plasma in a plasma processing chamber, the method comprising:

providing a chuck for supporting the substrate during plasma processing;

encircling said chunk with a focus ring;

positioning a stack of confinement rings, made of electrically insulating material, spaced apart from each other to form slots therebetween, said stack of confinement rings surrounding an interaction space defined between the top electrode and said chunk, each confinement ring having at least one cavity formed on the surface thereof; and passing at least one electrically conductive member through each of said cavity of said stack of confinement rings, a top of said at least one electrically conductive member electrically coupled to the top electrode, said electrically conductive member grounded at a bottom thereof.

6. The method according to claim 5 wherein said stack of rings comprises an electrically insulating material.

7. The method according to claim 6 wherein said electrically insulating material comprises quartz.

8. The method according to claim 5 wherein said electrically conductive member comprises aluminum.

* * * * *

UNITED STATES PATENT AND TRADEMARK OFFICE
CERTIFICATE OF CORRECTION

PATENT NO. : 6,716,762 B1
DATED : April 6, 2004
INVENTOR(S) : Eric H. Lenz

It is certified that error appears in the above-identified patent and that said Letters Patent is hereby corrected as shown below:

Column 6,
Line 24, replace "conducive" with -- conductive --.
Line 24, replace "compressing" with -- comprises --.

Signed and Sealed this

Twenty-first Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,716,762 B1
DATED : April 6, 2004
INVENTOR(S) : Lenz

It is certified that error appears in the above-identified patent and that said Letters Patent is hereby corrected as shown below:

Column 4,
Line 5, after "consistent from", delete "1".

Signed and Sealed this

Twentieth Day of September, 2005

JON W. DUDAS
*Director of the United States Patent and Trademark Office*